United States Patent
Ko et al.

(10) Patent No.: US 11,829,050 B2
(45) Date of Patent: Nov. 28, 2023

(54) ENTANGLED-PHOTON PAIR EMITTING DEVICE

(71) Applicant: ELECTRONICS AND TELECOMMUNICATIONS RESEARCH INSTITUTE, Daejeon (KR)

(72) Inventors: Young-Ho Ko, Daejeon (KR); Mireu Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/903,806

(22) Filed: Sep. 6, 2022

(65) Prior Publication Data
US 2023/0161222 A1 May 25, 2023

(30) Foreign Application Priority Data

Nov. 22, 2021 (KR) .................. 10-2021-0161312
May 6, 2022 (KR) .................. 10-2022-0056265

(51) Int. Cl.
*G02F 1/39* (2006.01)
*H10N 30/30* (2023.01)

(52) U.S. Cl.
CPC ............. *G02F 1/39* (2013.01); *H10N 30/30* (2023.02)

(58) Field of Classification Search
CPC .................................. G02F 1/39; H01N 30/30
See application file for complete search history.

(56) References Cited

U.S. PATENT DOCUMENTS

| 6,960,779 B2 * | 11/2005 | Shields ................ B82Y 20/00 257/17 |
| 8,404,506 B2 * | 3/2013 | Lochmann .............. H01S 5/34 372/45.01 |
| 11,575,065 B2 * | 2/2023 | Sangle ................ H01L 33/32 |

(Continued)

FOREIGN PATENT DOCUMENTS

| CN | 109457310 A | 3/2019 |
| CN | 209434220 U | 9/2019 |
| WO | WO-2010012268 A2 * | 2/2010 ............. B82Y 20/00 |

OTHER PUBLICATIONS

Jiaxiang Zhang et al., "High yield and ultrafast sources of electrically triggered entangled-photon pairs based on strain-tunable quantum dots," Nature Communications, 2015.

(Continued)

*Primary Examiner* — Daniel Petkovsek (57) ABSTRACT

An entangled-photon pair emitting device according to an embodiment of the inventive concept includes a piezoelectric structure having a first surface and a second surface, which face each other, wherein the piezoelectric structure includes an opening passing through the piezoelectric structure from the first surface to the second surface, a stress transfer medium that fills the opening, a light source emitting part disposed on the stress transfer medium, an upper electrode disposed on the first surface of the piezoelectric structure, and a lower electrode disposed on the second surface of the piezoelectric structure. Here, the light source emitting part includes a semiconductor thin-film and a quantum dot in the semiconductor thin-film.

11 Claims, 8 Drawing Sheets

(56) References Cited

U.S. PATENT DOCUMENTS

| | | |
|---|---|---|
| 2007/0128839 A1 | 6/2007 | Kim |
| 2011/0108744 A1 | 5/2011 | Stevenson |
| 2011/0165716 A1 | 7/2011 | Kim |
| 2021/0126431 A1* | 4/2021 | Aharon ................. H10N 30/30 |

OTHER PUBLICATIONS

Rinaldo Trotta et al., "Wavelength-tunable sources of entangled photons interfaced with atomic vapours," Nature Communications, 2016.

* cited by examiner

ENTANGLED-PHOTON PAIR EMITTING DEVICE

CROSS-REFERENCE TO RELATED APPLICATIONS

This U.S. non-provisional patent application claims priority under 35 U.S.C. § 119 of Korean Patent Application No. 10-2021-0161312, filed on Nov. 22, 2021, and 10-2022-0056265, filed on May 6, 2022, the entire contents of which are hereby incorporated by reference.

BACKGROUND

The present disclosure herein relates to an entangled-photon pair emitting device, and more particularly, to an entangled-photon pair emitting device using a piezoelectric structure.

A quantum dot refers to a semiconductor crystal having a size less than about 10 nm. When the quantum dot has a size less than an excitonic Bohr radius, the quantum dot may emit photons having various emission wavelengths by a quantum confinement effect. Particularly, the quantum dot is known to be an only material capable of emitting certainly rather than stochastically an entangled-photon pair used for quantum transmission or quantum imaging.

Here, the quantum dot may emit the entangled-photon pair in a method of artificially applying an electric field or a local stress from the outside of the quantum dot unless an ideal condition in which a structure of the quantum dot has a perfectly circular shape. Particularly, in case of applying the local stress, a wavelength of the entangled-photon pair generated according to an intensity of the stress may be significantly varied. That is, when a strong stress is applied to the quantum dot, a wavelength range of the entangled-photon pair emitted from the quantum dot may be widely controlled. Thus, methods for applying a strong stress to the quantum dot to widely control the wavelength range of the entangled-photon pair emitted from the quantum dot are being actively researched.

SUMMARY

The present disclosure provides an entangled-photon pair emitting device capable of applying a strong stress to a quantum dot to widely control a range of a wavelength of the entangled-photon pair emitted from the quantum dot.

An embodiment of the inventive concept provides an entangled-photon pair emitting device including: a piezoelectric structure having a first surface and a second surface, which face each other, wherein the piezoelectric structure includes an opening passing through the piezoelectric structure from the first surface to the second surface; a stress transfer medium configured to fill the opening; a light source emitting part disposed on the stress transfer medium; an upper electrode disposed on the first surface of the piezoelectric structure; and a lower electrode disposed on the second surface of the piezoelectric structure. Here, the light source emitting part includes a semiconductor thin-film and a quantum dot in the semiconductor thin-film.

In an embodiment, the opening may have a circular or polygonal shape in terms of a plane, and the opening may have a diameter or a width of about 10 μm to about 200 μm.

In an embodiment, the piezoelectric structure may further include a plurality of recesses defined in the first surface of the piezoelectric structure and connected with the opening.

In an embodiment, the stress transfer medium may include at least one of a polymer, a dielectric material, or metal or combination thereof.

In an embodiment, the polymer may include at least one of polydimethylsiloxane (PDMS), benzocyclobutene (BCB), hydrogen silsesquioxane (HSQ), and polyimide (PI).

In an embodiment, the semiconductor thin-film may include at least one of GaAs, InP, InGaAsP, GaN, or InAlAs, the quantum dot may include at least one of InAs, InGaN, or InGaAs, and the semiconductor thin-film may have a thickness of about 100 nm to about 500 nm.

In an embodiment, the light source emitting part may include a first pattern and second patterns, and the second patterns may be arranged in a form of a concentric circle with the first pattern at a center of the concentric circle.

In an embodiment, the piezoelectric structure may include at least one of lead zirconate titanate (PZT) or PMN-PT, and the piezoelectric structure may have a thickness of about 10 μm to about 500 μm.

In an embodiment, a top surface of the semiconductor thin-film may have a level less than that of the first surface of the piezoelectric structure.

In an embodiment, the light source emitting part may overlap the opening in a vertical direction.

In an embodiment of the inventive concept, an entangled-photon pair emitting device includes: a piezoelectric structure having a first surface and a second surface, which face each other, wherein the piezoelectric structure includes an opening passing through the piezoelectric structure from the first surface to the second surface; a stress transfer medium configured to fill the opening; a light source emitting part disposed on the stress transfer medium; an upper electrode disposed on the first surface of the piezoelectric structure; and a lower electrode disposed on the second surface of the piezoelectric structure. Here, the light source emitting part includes a semiconductor thin-film and a quantum dot in the semiconductor thin-film, the piezoelectric structure contacts the stress transfer medium while being spaced apart from the semiconductor thin-film, and the semiconductor thin-film contacts the stress transfer medium.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Advantages and features of the present invention, and implementation methods thereof will be clarified through following embodiments described with reference to the accompanying drawings. The present invention may, however, be embodied in many different forms and should not be construed as being limited to the embodiments set forth herein. Rather, these embodiments are provided so that this disclosure will be thorough and complete, and will fully convey the concept of the invention to those skilled in the art. Further, the present invention is only defined by scopes of claims. Like reference numerals refer to like elements throughout.

In the following description, the technical terms are used only for explaining a specific exemplary embodiment while not limiting the present disclosure. In the specification, the terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, the embodiment in the detailed description will be described with sectional views as ideal exemplary views of the present invention. Also, in the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region having a right angle illustrated in the drawings may have a round shape or a shape having a predetermined curvature. Areas exemplified in the drawings have general properties, and are used to illustrate a specific shape of a semiconductor package region. Thus, this should not be construed as limited to the scope of the present invention.

Hereinafter, an entangled-photon pair emitting device according to an embodiment of the inventive concept will be described in detail with reference to the accompanying drawings.

Figure 1:
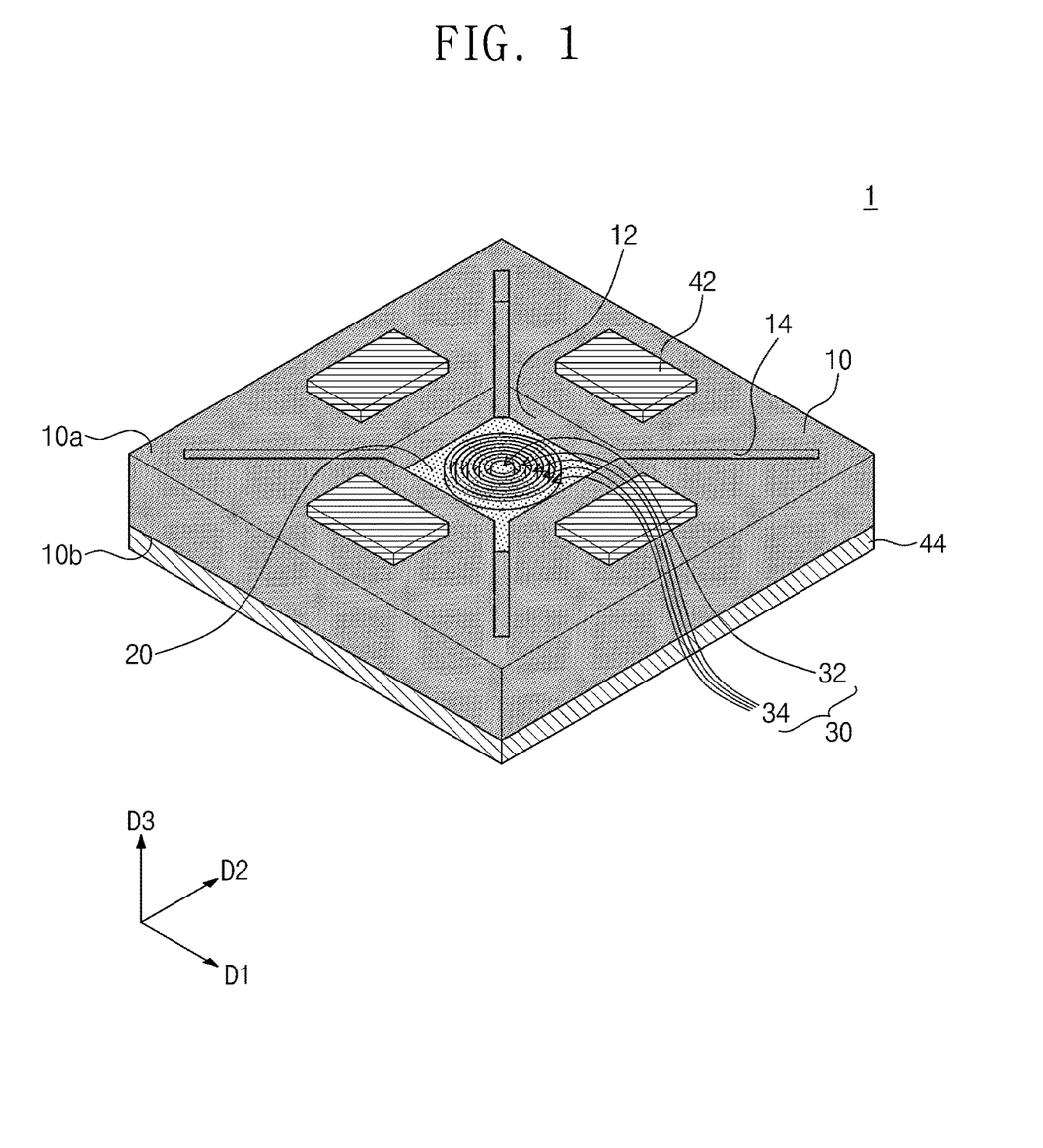
FIG. 1 is a perspective view illustrating an entangled-photon pair emitting device according to an embodiment of the inventive concept.
Figure 2A:
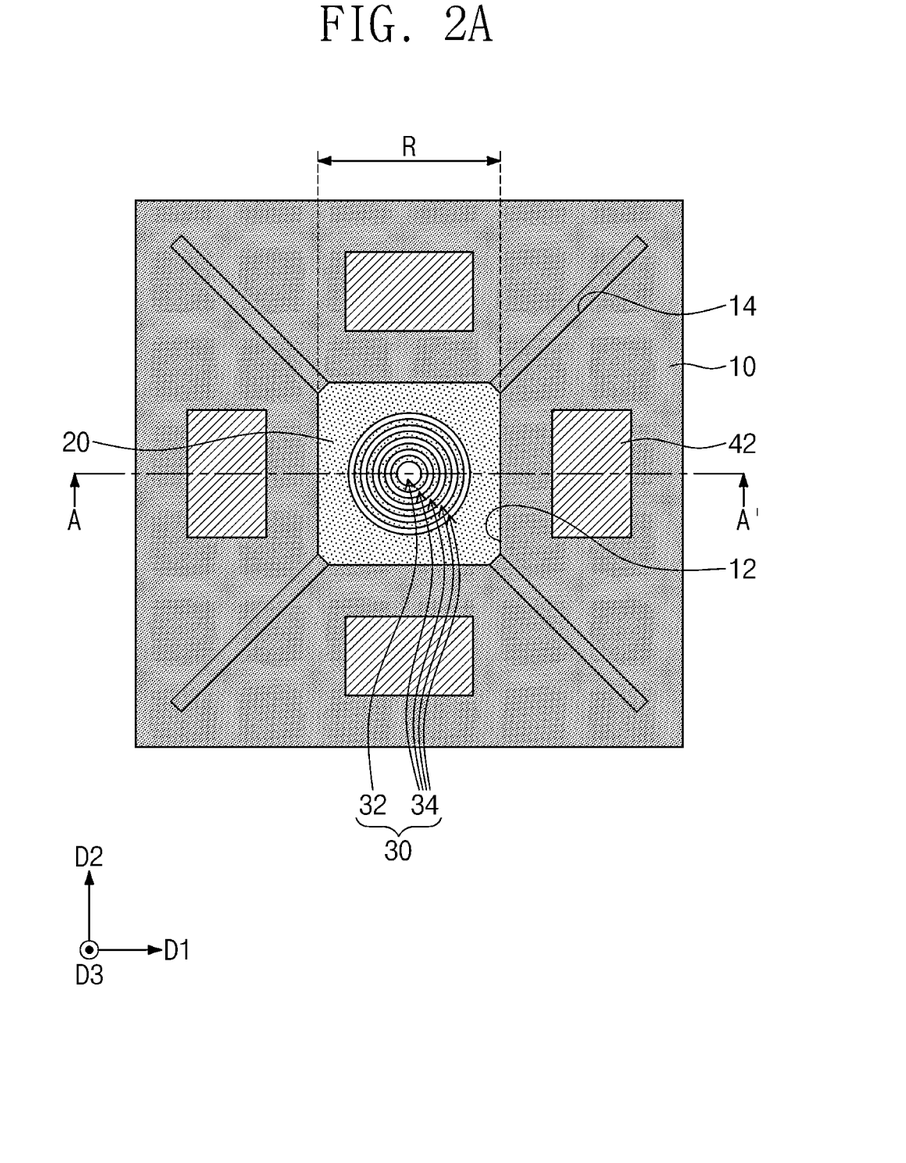
FIG. 2A is a top plan view illustrating the entangled-photon pair emitting device of FIG. 1.
Figure 2B:
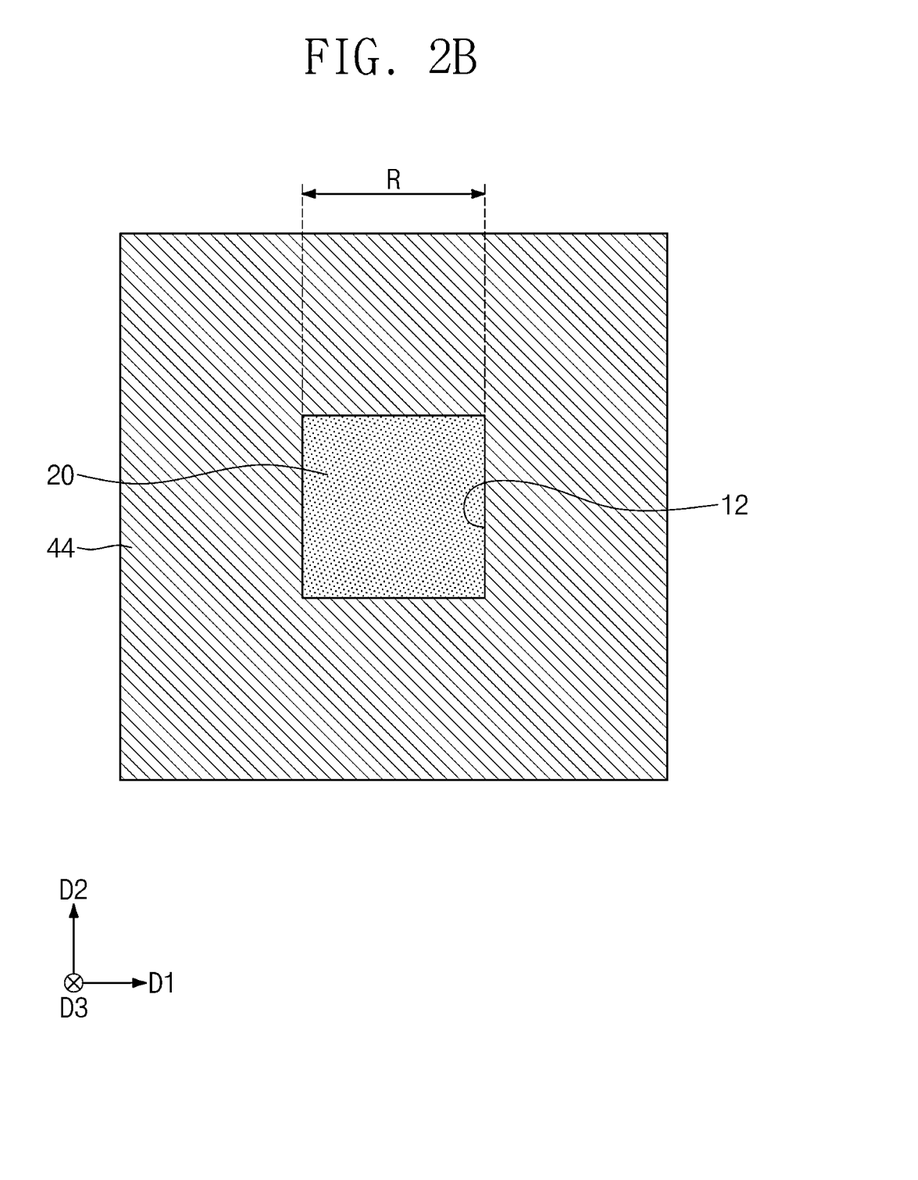
FIG. 2B is a bottom plan view illustrating the entangled-photon pair emitting device of FIG. 1.
Figure 2C:
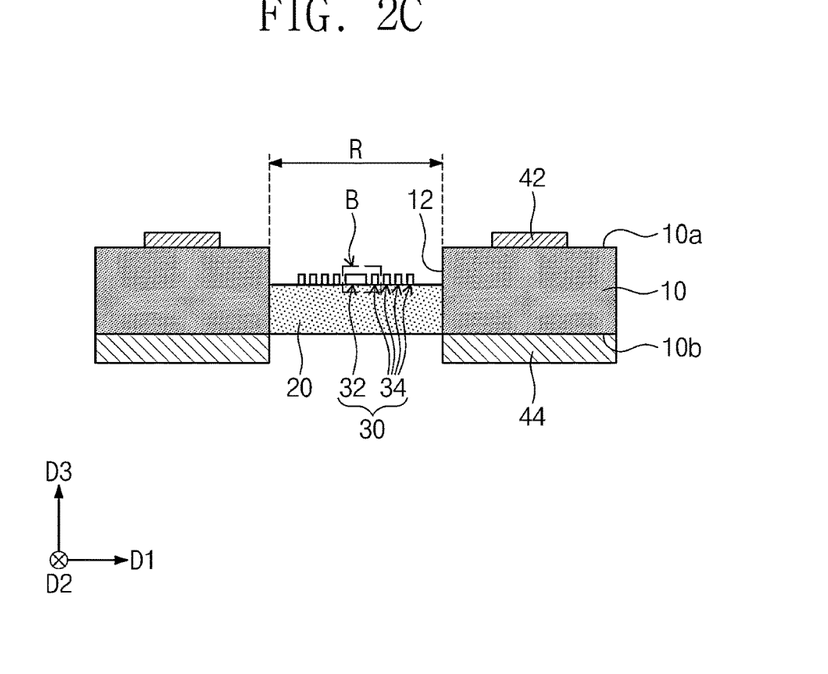
FIG. 2C is a cross-sectional view taken along line A-A' of FIG. 2A.
Figure 2D:
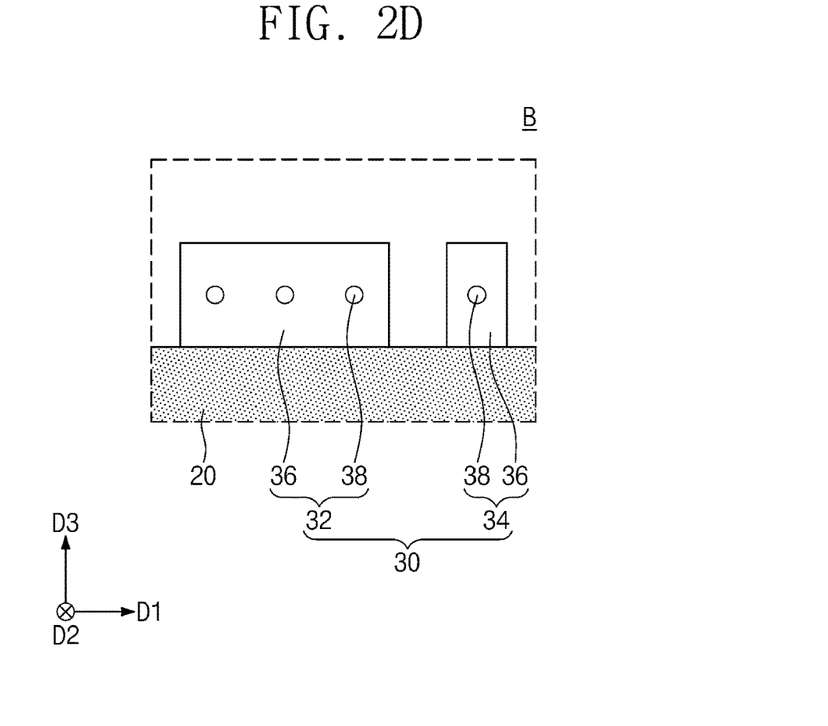
FIG. 2D is an enlarged view of portion B of FIG. 2C.

FIG. 1 is a perspective view illustrating an entangled-photon pair emitting device according to an embodiment of the inventive concept. FIG. 2A is a top plan view illustrating the entangled-photon pair emitting device of FIG. 1. FIG. 2B is a bottom plan view illustrating the entangled-photon pair emitting device of FIG. 1. FIG. 2C is a cross-sectional view taken along line A-A' of FIG. 2A. FIG. 2D is an enlarged view of portion B of FIG. 2C.

Referring to FIGS. 1 to 2D, an entangled-photon pair emitting device 1 may include a piezoelectric structure 10, a stress transfer medium 20, a light source emitting part 30, upper electrodes 42, and a lower electrode 44. The piezoelectric structure 10 may include a first surface 10a and a second surface 1b, which face each other.

In this specification, a first direction D1 represents a direction parallel to the first surface 10a of the piezoelectric structure 10. A second direction D2 represents a direction parallel to the first surface 10a of the piezoelectric structure 10 and cross the first direction D1. A third direction D3 represents a direction perpendicular to the first surface 10a of the piezoelectric structure 10.

The piezoelectric structure 10 may include an opening 12 passing through the piezoelectric structure 10 from the first surface 10a to the second surface 10b in the third direction D3. The opening 12 may have various shapes in terms of a plane. For example, the opening 12 may have a circular or polygonal shape in terms of the plane. The opening 12 may have a constant diameter in terms of the plane or a width R in the first direction D1. For example, the opening 12 may have the diameter or the width R in the first direction D1, which is about 10 μm to about 200 μm.

The piezoelectric structure 10 may include a piezoelectric material. For example, the piezoelectric structure 10 may include lead zirconate titanate (PZT) or PMN-PT. The piezoelectric structure 10 may have a thickness in the third direction D3, which is about 10 μm to about 500 μm.

The piezoelectric structure 10 may include a plurality of recesses 14 defined in the first surface 10a of the piezoelectric structure 10 and connected with the opening 12. Each of the recesses 14 may have a line shape in terms of the plane. For example, in terms of the plane, the opening 12 may have a rectangular shape, and each of the recesses 14 may extend from each of vertices of the opening in a diagonal direction. The recesses 14 may not completely pass through the piezoelectric structure 10.

The stress transfer medium 20 that fills the opening 12 of the piezoelectric structure 10 may be provided. The stress transfer medium 20 may contact an inner surface of the piezoelectric structure 10. According to some embodiments, a top surface of the stress transfer medium 20 may have a level less than that of the first surface 10a of the piezoelectric structure 10. According to other embodiments, the top surface of the stress transfer medium 20 may have a level equal to or greater than that of the first surface 10a of the piezoelectric structure 10. Also, a bottom surface of the stress transfer medium 20 may have a level higher than that of the second surface 10b of the piezoelectric structure 10. Also, a bottom surface of the stress transfer medium 20 may have a level higher than that of the second surface 10b of the piezoelectric structure 10.

The stress transfer medium 20 may include a material capable of transmitting a strain generated in the piezoelectric structure 10 to the light source emitting part 30 that will be described later in a form of a stress. For example, the stress transfer medium 20 may include a polymer, a dielectric material, or metal. The polymer may include, e.g., polydimethylsiloxane (PDMS), benzocyclobutene (BCB), hydrogen silsesquioxane (HSQ), and polyimide (PI). The dielectric material may include, e.g., polycrystalline silicon (Si).

The light source emitting part 30 may be disposed on the stress transfer medium 20. The light source emitting part 30 may be disposed on the stress transfer medium 20. The light source emitting part 30 may be spaced apart from an inner wall of the opening 12 of the piezoelectric structure 10.

The light source emitting part 30 may include a first pattern 32 and second patterns 34. In terms of the plane, the second patterns 34 may be arranged in a form of a concentric circle or an ellipse with the first pattern 32 at a center thereof. In terms of the plane, the first pattern 32 may have a circular or elliptical shape. In terms of the plane, each of the second patterns 34 may have a circular ring or an elliptical ring shape. The first pattern 32 and the second patterns 34 of the light source emitting part 30 may provide a circular optical grating structure. As the light source emitting part 30 has the circular optical grating structure, a light source emitted from the light source emitting part 30 may be prevented from being emitted in the first direction D1 and the second direction D2. Through this, an optical loss may be reduced, and an extraction efficiency of the entangled-photon pair emitted from the light source emitting part 30 may increase.

According to some embodiments, a top surface of the light source emitting part 30 may have a level less than that of the first surface 10a of the piezoelectric structure 10. According to other embodiments, the top surface of the light source emitting part 30 may have a level equal to or greater than that of the first surface 10a of the piezoelectric structure 10.

Each of the first pattern 32 and the second patterns 34 of the light source emitting part 30 may include a material capable of emitting an entangled-photon. As illustrated in FIG. 2D, each of the first pattern 32 and the second patterns 34 may include a semiconductor thin-film 36 and a quantum dot 38 in the semiconductor thin-film 36. The semiconductor thin-film 36 may include GaAs, InP, InGaAsP, GaN, or InAlAs. The quantum dot 38 may include InAs, InGaN, or InGaAs.

According to other embodiments, unlike FIG. 2D, each of the first pattern 32 and the second patterns 34 may include tungsten diselenide (WSe2) and/or tungsten disulfide (WS2). The light source emitting part 30 may have a third directional thickness of about 100 nm to about 500 nm.

The upper electrodes 42 may be disposed on the first surface 10a of the piezoelectric structure 10. In terms of the plane, the upper electrodes 42 may surround the opening 12 and the stress transfer medium 20. The upper electrodes 42 may be spaced apart from the opening 12 and the stress transfer medium 20 in the first direction D1 and the second direction D2. In terms of the plane, the upper electrodes 42 may be spaced apart from each other with the recesses 14 therebetween.

Each of the upper electrodes 42 may include metal. For example, each of the upper electrodes 42 may include titanium (Ti), chromium (Cr), platinum (Pt), germanium (Ge) and/or gold (Au).

The lower electrode 44 may be disposed on the second surface 10b of the piezoelectric structure 10. The lower electrode 44 may not overlap the stress transfer medium 20 and the opening 12 of the piezoelectric structure 10 in a vertical direction. The lower electrode 44 may overlap the upper electrodes 42 in the vertical direction. The lower electrode 44 may include metal. For example, the lower electrodes 44 may include titanium (Ti), chromium (Cr), platinum (Pt), germanium (Ge) and/or gold (Au).

An electric field may be applied to the piezoelectric structure 10 by applying a voltage to the upper electrodes 42 and the lower electrode 44. A displacement may be generated in the piezoelectric structure 10 by the electric field. As the upper electrodes 42 are provided in plurality, a direction of the displacement generated in the piezoelectric structure 10 may be easily adjusted. According to some embodiment, only one upper electrode 42 may be provided. The recesses 14 of the piezoelectric structure 10 may prevent displacements generated in the piezoelectric structure 10 in different directions from overlapping each other.

The displacement of the piezoelectric structure 10 may apply a stress to the stress transfer medium 20, and the applied stress may cause a displacement of the stress transfer medium 20. The displacement of the stress transfer medium 20 may apply a stress to the light source emitting part 30 to emit the entangled-photon pair from the light source emitting part 30. As the light source emitting part 30 is disposed in the piezoelectric structure 10, i.e., in the opening 12, the stress applied to the light source emitting part 30 may increase. Particularly, the applied stress may increase as a diameter of the opening 12 of the piezoelectric structure 10 or a width R in the first direction D1 decreases. As the stress applied to the light source emitting part 30 increases, an entangled-photon pair emitting efficiency may increase, and a wavelength control range of the entangled-photon pair may widen.

Figure 3A:
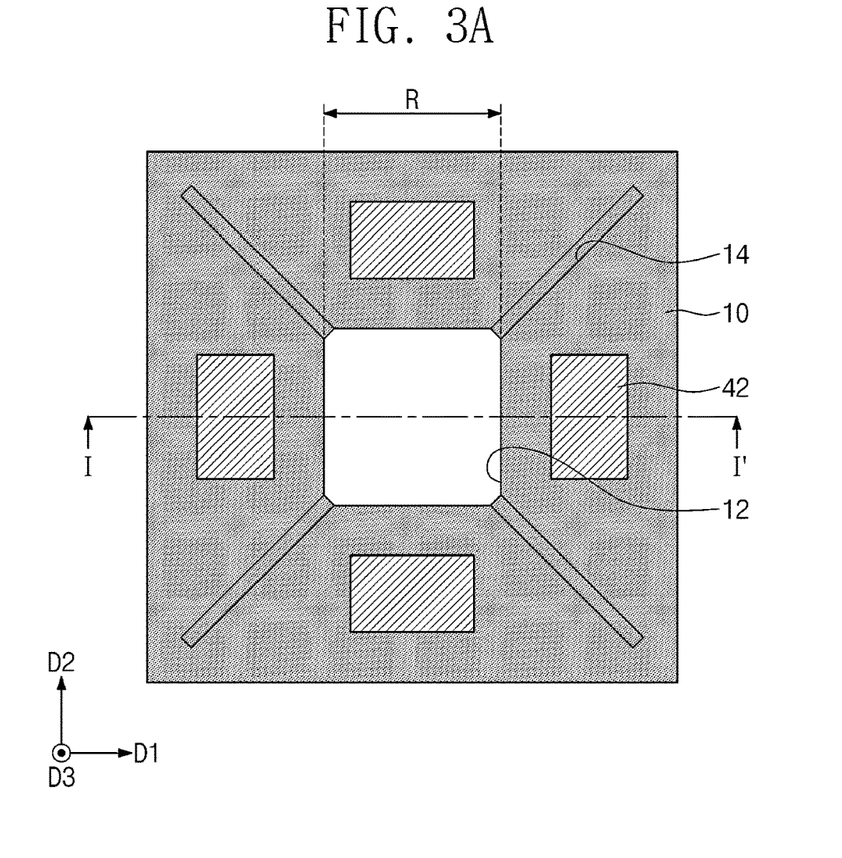
FIGS. 3A and 4A are cross-sectional views illustrating a method for manufacturing an entangled-photon pair emitting device according to an embodiment of the inventive concept.
Figure 3B:
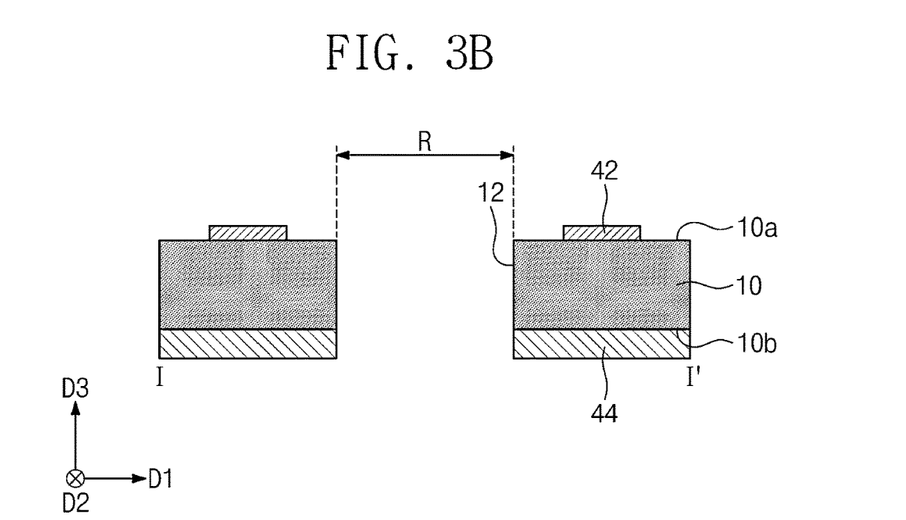
FIGS. 3B and 4B are cross-sectional views taken along line I-I' of FIGS. 3A and 4A, respectively.
Figure 4A:
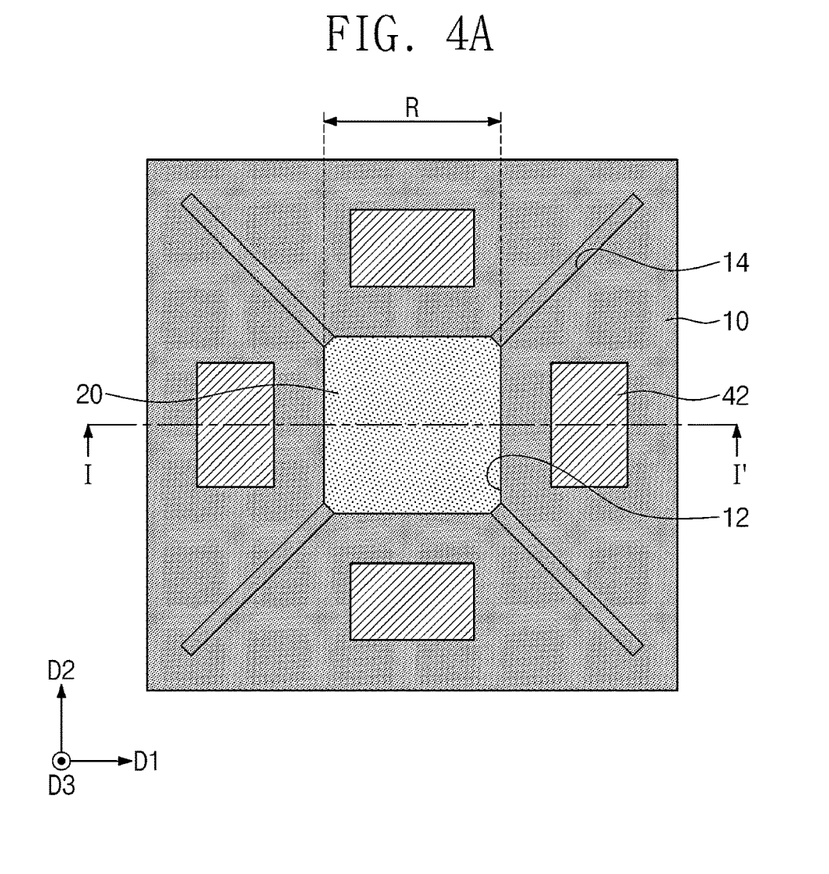
Figure 4B:
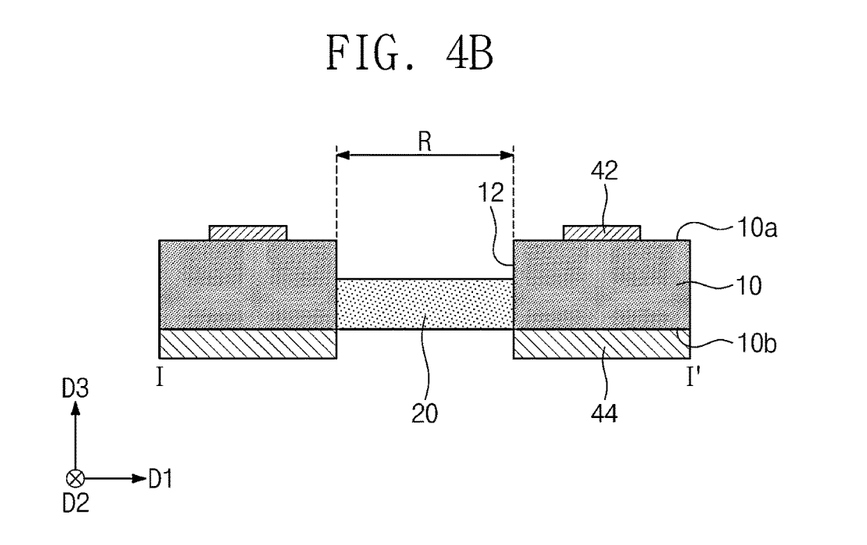

FIGS. 3A and 4A are cross-sectional views illustrating a method for manufacturing an entangled-photon pair emitting device according to an embodiment of the inventive concept. FIGS. 3B and 4B are cross-sectional views taken along line I-I' of FIGS. 3A and 4A, respectively.

Referring to FIGS. 3A and 3B, a piezoelectric structure 10 may be formed. An opening 12 and recesses 14 may be formed in a piezoelectric material through laser etching.

Upper electrodes 42 may be formed on a first surface 10a of the piezoelectric structure 10. A lower electrode 44 may be formed on a second surface 10b of the piezoelectric structure 10. The upper electrodes 42 and the lower electrode 44 may be formed on the first surface 10a and the second surface 10b, respectively, through a photolithography process and a deposition process. A plating process may be performed instead of the deposition process.

Referring to FIGS. 4A and 4B, a stress transfer medium 20 may be formed in an opening 12. When the stress transfer medium 20 is a polymer, the stress transfer medium 20 may be formed by filling the polymer in the opening 12 and then heating and curing the filled polymer. When the stress transfer medium 20 is a dielectric material or metal, the stress transfer medium 20 having a shape corresponding to that of the opening 12 may be manufactured from the outside and then put into the opening 12.

Referring to FIGS. 2A, 2C, and 3D again, a light source emitting part 30 may be formed. The light source emitting part 30 including a first pattern 32 and second patterns 34 may be formed by performing a photolithography process and an etching process on a semiconductor thin-film 36 containing a quantum dot 38 therein. The light source emitting part 30 may be manufactured separately from the outside and then transferred and attached onto the stress transfer medium 20. Alternatively, the light source emitting part 30 may be manufactured directly on the stress transfer medium 20 instead of being manufactured separately from the outside. Thus, an entangled-photon pair emitting device 1 may be manufactured.

Figure 5:
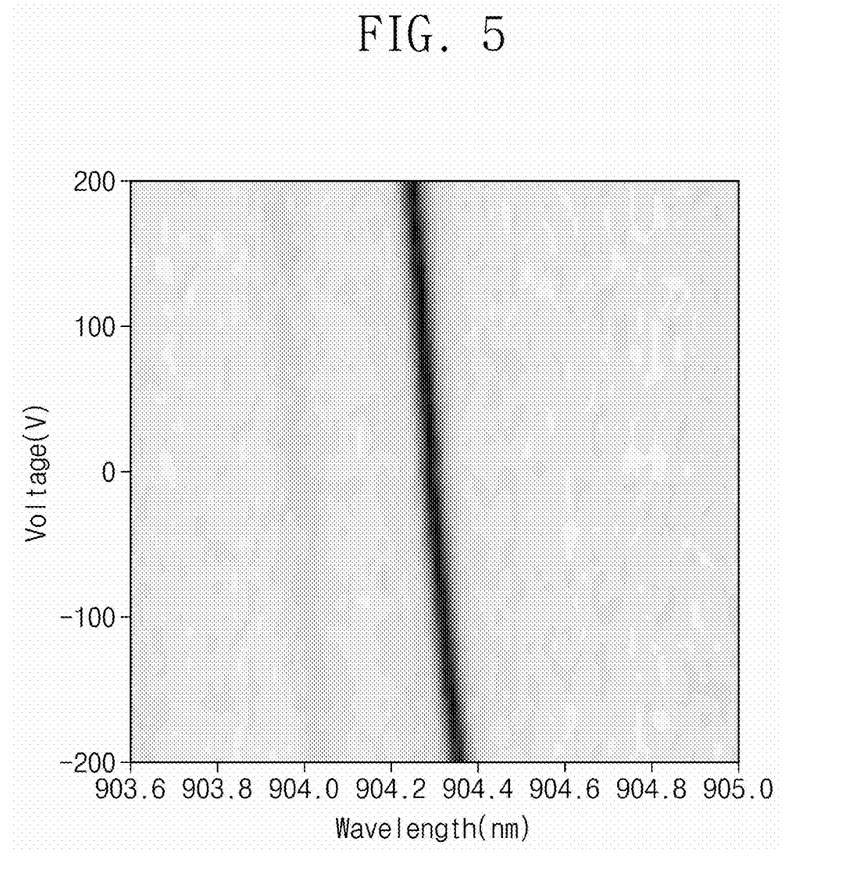
FIG. 5 is a graph showing results of a wavelength variation experiment according to a comparative example.
Figure 6:
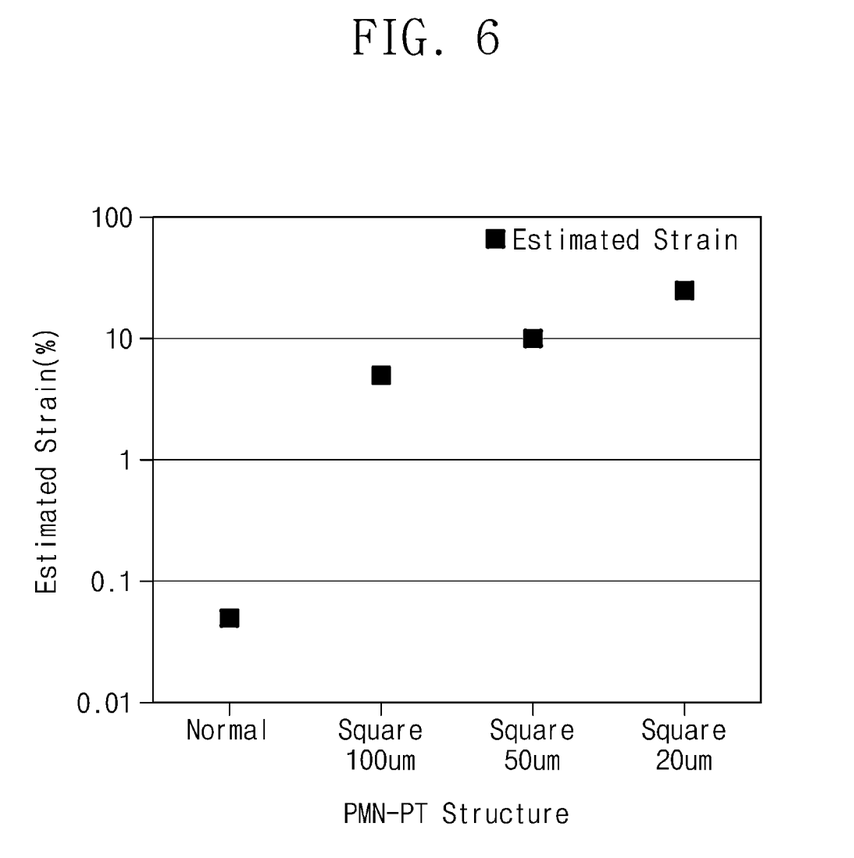
FIG. 6 is a graph showing results of a strain variation simulation according to an embodiment of the inventive concept and the comparative example.

FIG. 5 is a graph showing results of a wavelength variation experiment according to a comparative example. FIG. 6 is a graph showing results of a strain variation simulation according to an embodiment of the inventive concept and the comparative example.

The comparative example represents an entangled-photon emitting device in which a quantum dot is disposed on a piezoelectric material without an opening, and upper electrodes and a lower electrode are disposed on a top surface and a bottom surface of the piezoelectric material, respectively.

Referring to FIG. 5, a difference between wavelengths of light sources generated when a voltage in a range from about −200 V to about 200 V to the piezoelectric material of the comparative example is only 0.2 nm or less.

Referring to FIG. 6, three right-side dots of the simulation (dots corresponding to Square 100 μm, Square 50 μm, Square 20 μm of a horizontal axis) show calculated values of strains generated in the light source emitting part 30 according to the diameter or width of the opening 12 when a voltage of about 200 V is applied in an embodiment of the inventive concept. One left-side dot of the simulation (a dot corresponding to Normal of the horizontal axis) shows a calculated value of a strain generated in the quantum dot when a voltage of about 200 V is applied in the comparative example. The calculated values according to an embodiment of the inventive concept are about 5%, about 10%, and about 25% when the diameter or width of the opening 12 is about 100 μm, about 50 μm, and about 20 μm, respectively. The calculated value of the strain according to the comparative example is about 0.05%. From this, it may be known that the stain value according to an embodiment of the inventive concept is greater than that according to the comparative example.

According to the embodiment of the inventive concept, as the light source emitting part including the quantum dot is disposed in the opening of the piezoelectric structure, the intensity of the stress transmitted from the piezoelectric structure to the light source emitting part may increase. Thus, the efficiency of emitting the entangled-photon pair may increase, and the wavelength control range of the entangled-photon pair may widen.

Also, the optical loss in the plane direction may be reduced by the circular optical grating structure of the light source emitting part, and the light extraction efficiency may increase.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. An entangled-photon pair emitting device comprising:
   a piezoelectric structure having a first surface and a second surface, which face each other, wherein the piezoelectric structure comprises an opening passing through the piezoelectric structure from the first surface to the second surface;
   a stress transfer medium configured to fill the opening;
   a light source emitting part disposed on the stress transfer medium;
   a plurality of upper electrodes disposed on the first surface of the piezoelectric structure, the plurality of upper electrodes provided on both sides of the opening in a first direction and provided on both sides of the opening in a second direction crossing the first direction;
   a plurality of open recesses in the first surface of the piezoelectric structure and connected with the opening, wherein each open recess of the plurality of open recesses is located between adjacent upper electrodes of the plurality of upper electrodes and extends in diagonal directions between the first and second directions; and
   a lower electrode disposed on the second surface of the piezoelectric structure,
   wherein the light source emitting part comprises a semiconductor thin-film and a quantum dot in the semiconductor thin-film.

2. The entangled-photon pair emitting device of claim 1, wherein the opening has a circular or polygonal shape, and the opening has a diameter or a width of about 10 μm to about 200 μm.

3. The entangled-photon pair emitting device of claim 2, wherein the recesses are linear channels.

4. The entangled-photon pair emitting device of claim 1, wherein the stress transfer medium comprises at least one of a polymer, a dielectric material, or metal or combination thereof.

5. The entangled-photon pair emitting device of claim 4, wherein the stress transfer medium is a polymer and comprises at least one of polydimethylsiloxane (PDMS), benzocyclobutene (BCB), hydrogen silsesquioxane (HSQ), and polyimide (PI).

6. The entangled-photon pair emitting device of claim 1, wherein the semiconductor thin-film comprises at least one of GaAs, InP, InGaAsP, GaN, or InAlAs,
   the quantum dot comprises at least one of InAs, InGaN, or InGaAs, and
   the semiconductor thin-film has a thickness of about 100 nm to about 500 nm.

7. The entangled-photon pair emitting device of claim 1, wherein the light source emitting part comprises a first pattern and second patterns, and
   the second patterns are concentric circles or ellipses with the first pattern at a center of the concentric circles or ellipses.

8. The entangled-photon pair emitting device of claim 1, wherein the piezoelectric structure comprises at least one of lead zirconate titanate (PZT) or lead magnesium niobate-lead titanate (PMN-PT), and
   the piezoelectric structure has a thickness of about 10 μm to about 500 μm.

9. The entangled-photon pair emitting device of claim 1, wherein a top surface of the semiconductor thin-film has a level lower than that of the first surface of the piezoelectric structure.

10. The entangled-photon pair emitting device of claim 1, wherein the light source emitting part overlaps the opening in a vertical direction.

11. An entangled-photon pair emitting device comprising:
    a piezoelectric structure having a first surface and a second surface, which face each other, wherein the piezoelectric structure comprises an opening passing through the piezoelectric structure from the first surface to the second surface;
    a stress transfer medium configured to fill the opening;
    a light source emitting part disposed on an exposed upper surface of the stress transfer medium;
    a plurality of upper electrodes disposed on the first surface of the piezoelectric structure, the plurality of upper electrodes provided on both sides of the opening in a first direction and provided on both sides of the opening in a second direction crossing the first direction;
    a plurality of open recesses in the first surface of the piezoelectric structure and connected with the opening, wherein each open recess of the plurality of open recesses is located between adjacent upper electrodes of the plurality of upper electrodes and extends in diagonal directions between the first and second directions; and
    a lower electrode disposed on the second surface of the piezoelectric structure,
    wherein the light source emitting part comprises a semiconductor thin-film and a quantum dot in the semiconductor thin-film, the piezoelectric structure contacts the stress transfer medium while being spaced apart from the semiconductor thin-film, and the semiconductor thin-film contacts the stress transfer medium, wherein the light source emitting part comprises a first pattern and second patterns, and the second patterns are an optical grating of concentric circles or ellipses with the first pattern at a center of the concentric circles or ellipses.

\* \* \* \* \*